US005298437A

United States Patent [19]

McFarlane et al.

[11] Patent Number: 5,298,437
[45] Date of Patent: Mar. 29, 1994

[54] FABRICATION PROCESS FOR SCHOTTKY BARRIER DIODES ON A SINGLE POLY BIPOLAR PROCESS

[75] Inventors: Brian McFarlane, Campbell; Frank Marazita; John E. Readdie, both of San Jose, all of Calif.

[73] Assignee: National Semiconductor Corporation, Santa Clara, Calif.

[21] Appl. No.: 922,341

[22] Filed: Jul. 28, 1992

Related U.S. Application Data

[63] Continuation of Ser. No. 627,160, Dec. 13, 1990, abandoned.

[51] Int. Cl.5 ............................................ H01L 21/265
[52] U.S. Cl. ........................................ 437/31; 437/7; 437/39; 437/175; 437/178; 148/DIG. 140
[58] Field of Search .................. 437/31, 57, 55, 175, 437/178, 201, 39, 7, 31, 7, 39; 148/DIG. 139, DIG. 140

[56] References Cited

U.S. PATENT DOCUMENTS

| | | | |
|---|---|---|---|
| 4,609,568 | 9/1986 | Koh et al. | 427/85 |
| 4,628,339 | 12/1986 | Vora et al. | 357/15 |
| 4,674,173 | 6/1987 | Hahn et al. | 437/32 |
| 4,717,678 | 1/1988 | Goth | 437/30 |
| 4,764,480 | 8/1988 | Vora | 437/54 |
| 4,835,580 | 5/1989 | Havemann et al. | 357/15 |
| 4,897,364 | 1/1990 | Nguyen | 437/69 |
| 4,898,838 | 2/1990 | Morris et al. | 437/31 |
| 4,969,027 | 11/1990 | Baliga et al. | 357/38 |
| 4,983,531 | 1/1991 | Cosentino | 437/31 |
| 5,059,555 | 10/1991 | Iranmanesh et al. | 437/201 |

FOREIGN PATENT DOCUMENTS

| | | |
|---|---|---|
| 0107437 | 5/1984 | European Pat. Off. . |
| 0112773 | 7/1984 | European Pat. Off. . |
| 0304729 | 3/1989 | European Pat. Off. . |

OTHER PUBLICATIONS

Humphrey, "use of Oxidized Silicon Nitride as an Etch Stop for Plasma Etching", IBM Tech. Disc. Bul., vol. 23, No. 4, Sep. 1990 pp. 1360.

Szernro, et al., "Some Metallization Problems of Schotty-Clamped Transistors", *This Solid Films*, 36:2, 431–434, 1976.

*Primary Examiner*—Brian E. Hearn
*Assistant Examiner*—Tuan Nguyen
*Attorney, Agent, or Firm*—Townsend & Townsend

[57] ABSTRACT

A method for fabricating a diode, for example, for use in a Schottky clamped transistor, which as a process step disposes a layer of oxide between the substrate and the overlying layer of polysilicon which must ultimately be etched away. The oxide layer permits use of an end point dry etch process which in turn allows greater miniaturization of the circuit over wet etch processes. Use of the end point process made feasible by the oxide layer also prevents overetch of the silicon material. As a result, a more ideal metal silicide anode-to-substrate Schottky barrier is formed with corresponding improvements in the diode ideality factor. In addition the oxide layer eliminates Schottky mask alignment problems and further improves diode performance characteristics by elimination of parasitic diodes. The process can be implemented with minimal deviation from other core processes used to fabricate similar circuits.

17 Claims, 10 Drawing Sheets

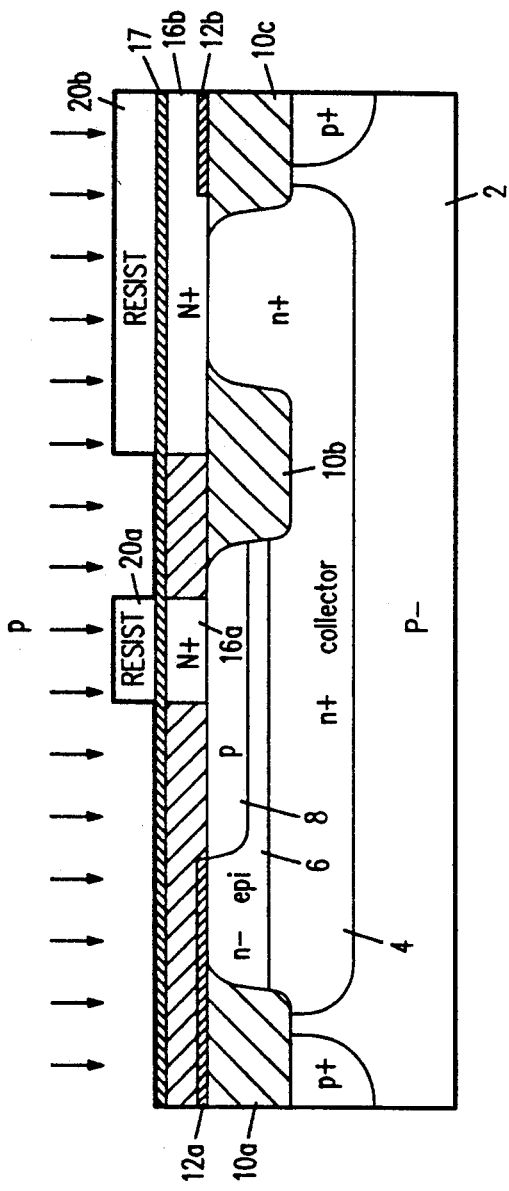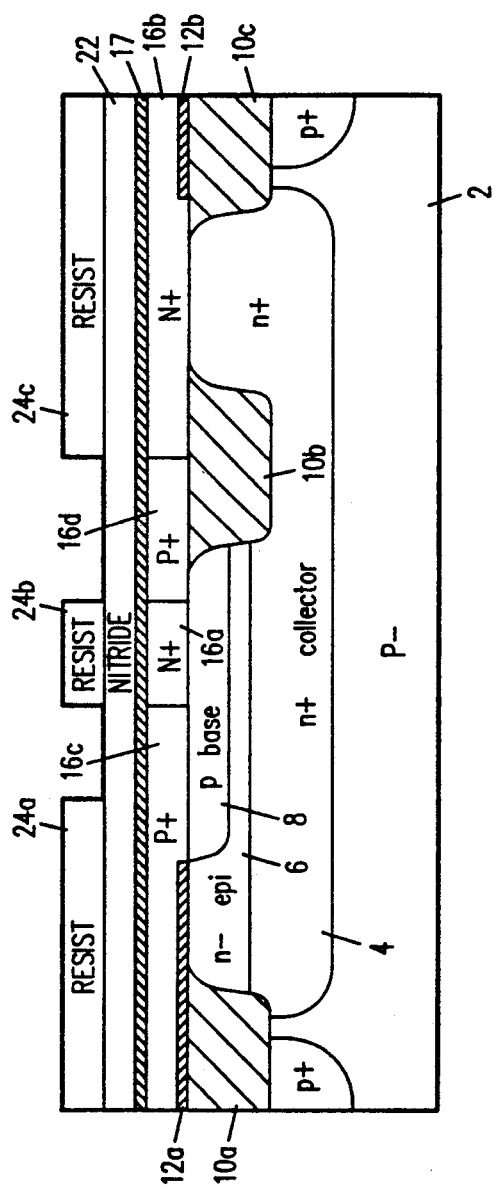
FIG. 5
FIG. 6

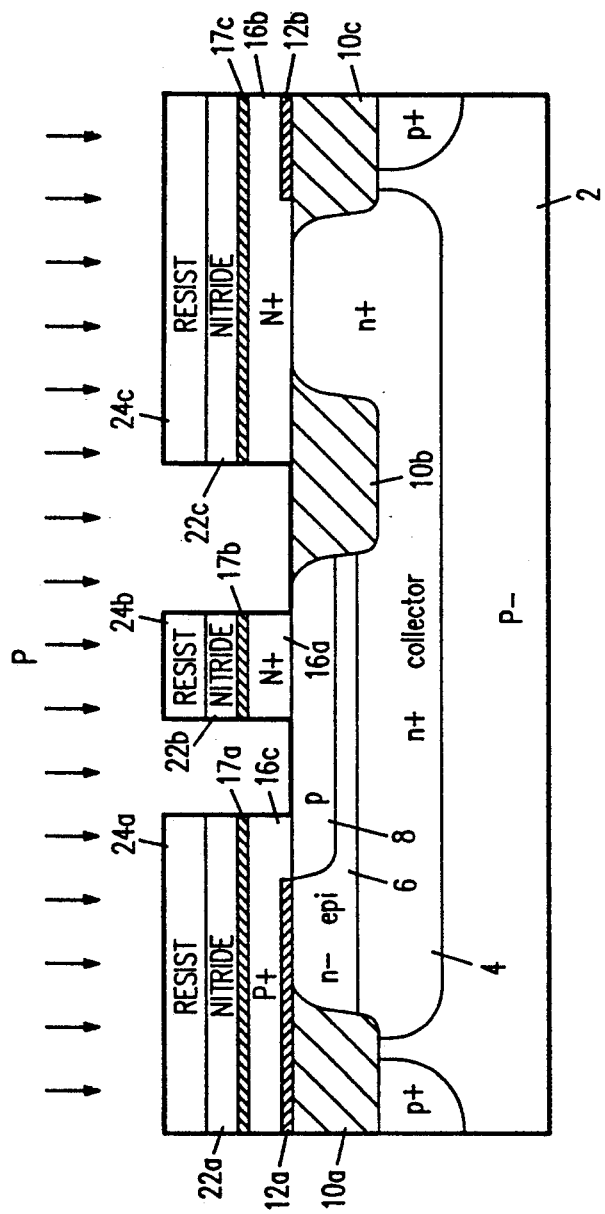
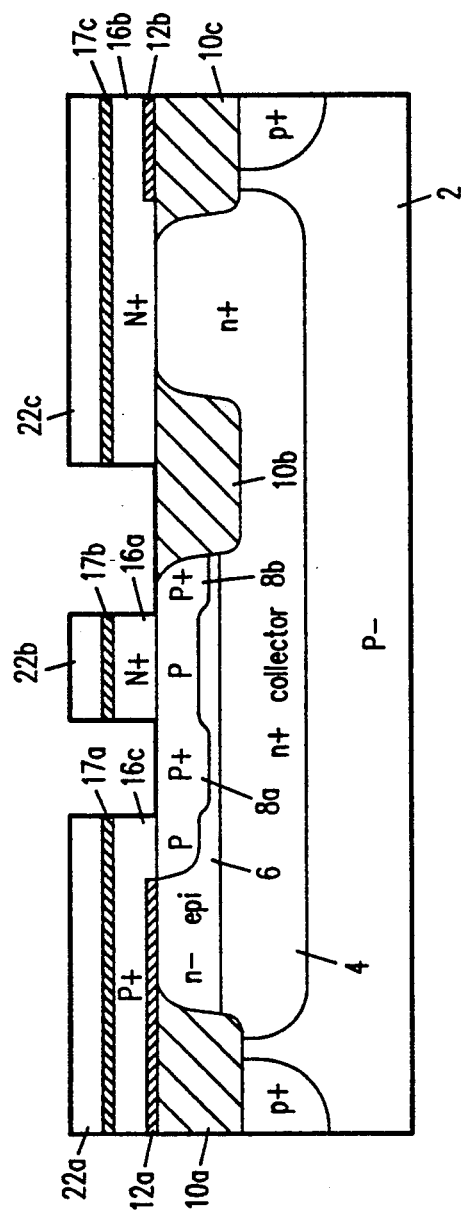
FIG. 7
FIG. 8

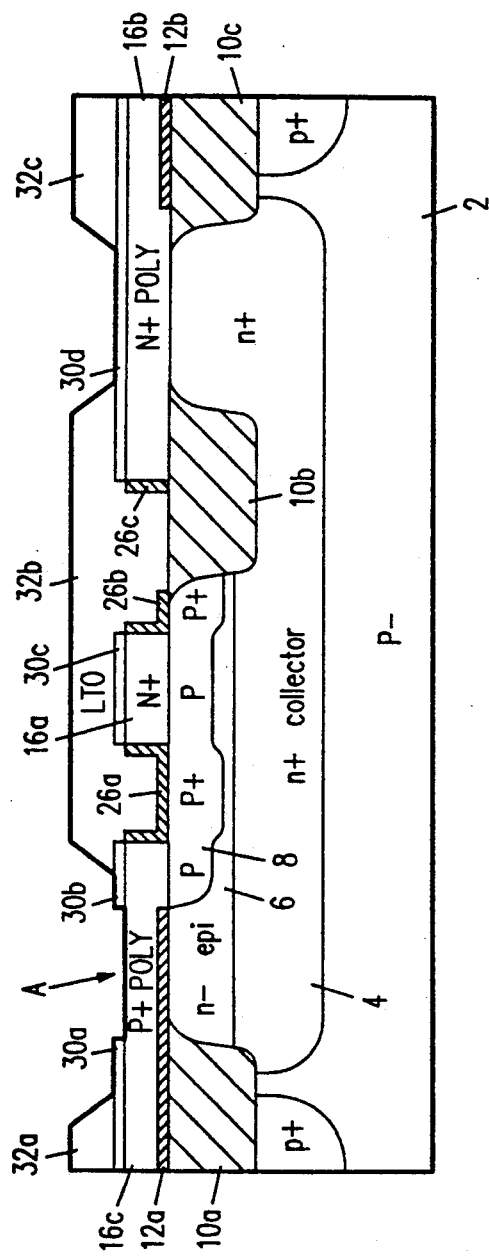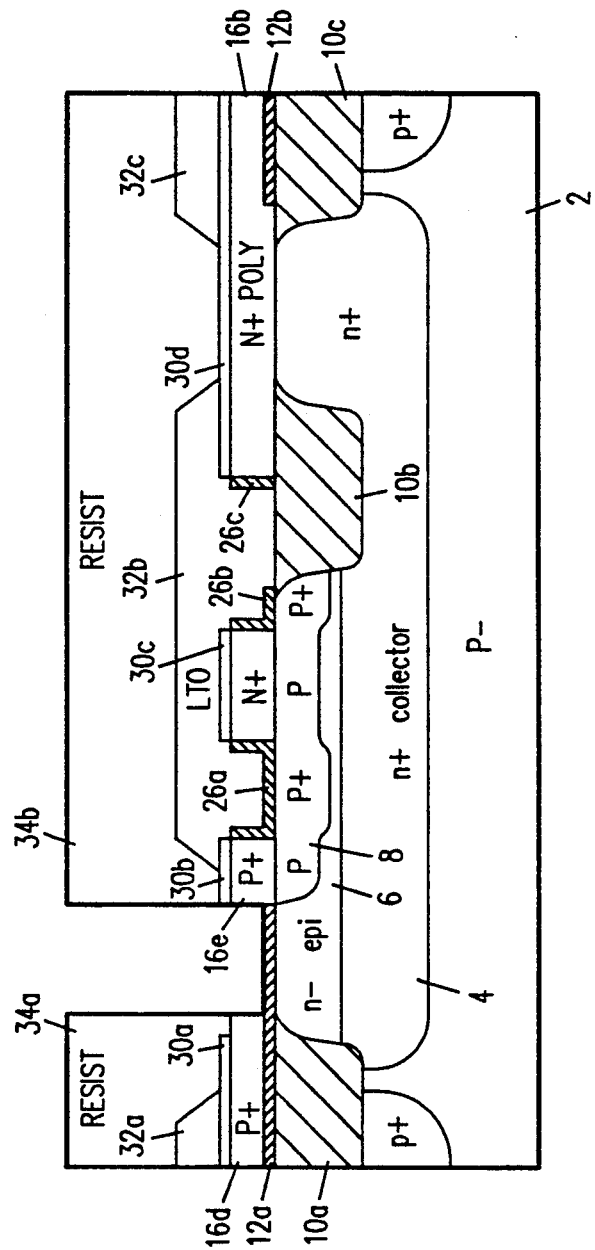
FIG. 11
FIG. 12

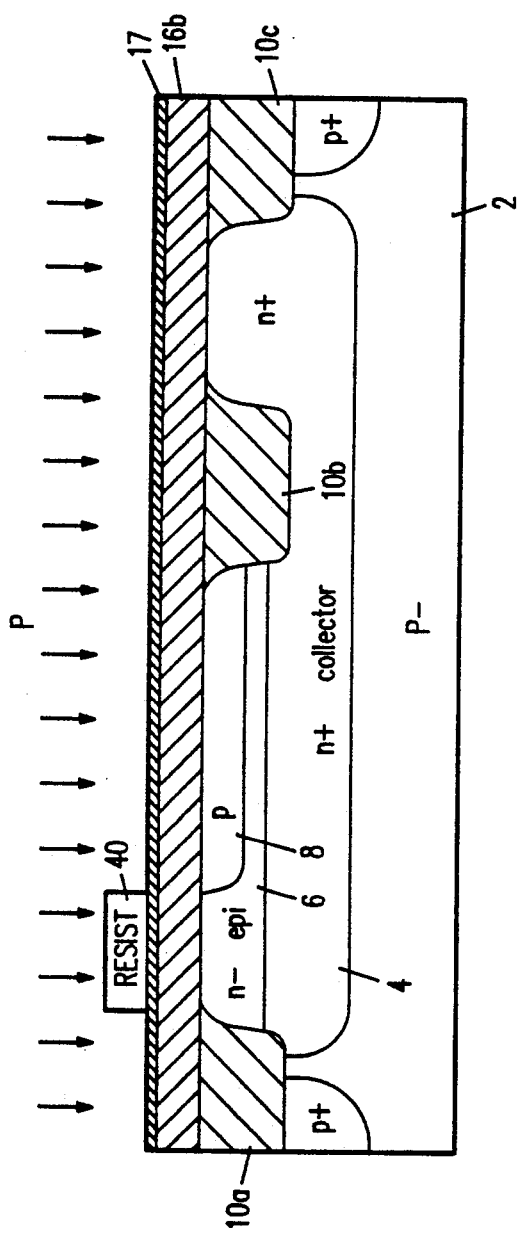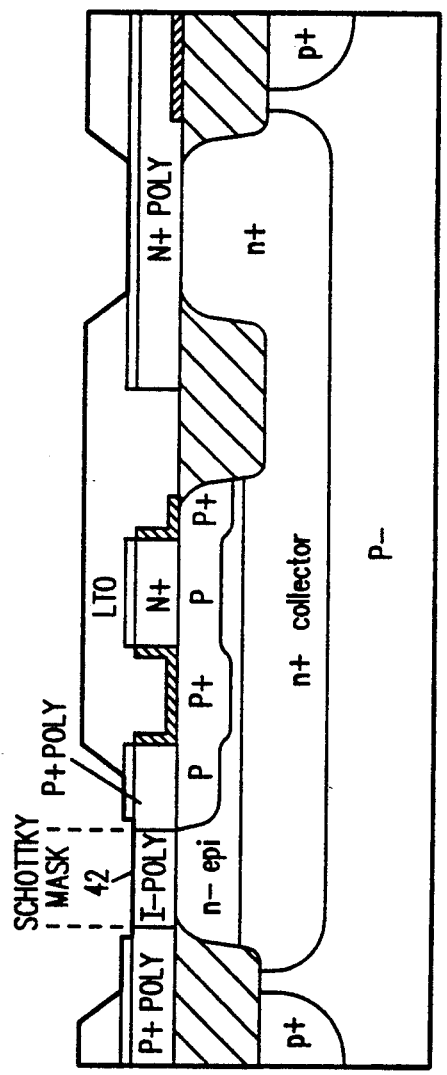
PRIOR ART
FIG. 15
PRIOR ART
FIG. 16

5,298,437

FABRICATION PROCESS FOR SCHOTTKY BARRIER DIODES ON A SINGLE POLY BIPOLAR PROCESS

This is a continuation of application Ser. No. 07/627,160 filed Dec. 13, 1990, now abandoned.

BACKGROUND OF THE INVENTION

Transistor saturation occurs when excessive currents are applied to the bases of bipolar transistors, driving the collector-base diode into forward bias and thus injecting minority carrier into the base of the transistor. Removal of this charge from the base results in slow turnoff characteristics of the transistor. Saturation can thus degrade the performance of high-speed switching circuits.

In semiconductor circuits, the use of Schottky barrier diodes is a popular means of preventing transistor saturation. The Schottky barrier diode maintains a low voltage across the base-collector diode thus preventing this junction from becoming forward biased and saturating the transistor. The resulting semiconductor transistor circuit is known as a Schottky clamped transistor.

The effectiveness of the Schottky clamp is limited by the ideality factor of the barrier diode. The typical Schottky diode is formed by depositing a metal layer on a lightly doped N−type silicon material. Irregularities in the surface of the N−type material cause imperfections in the metal to N−type silicon contact. These imperfections in the metal to N−type silicon contact contribute to nonideality.

In typical fabrication processes, a polysilicon layer which has been deposited over the surface of the semiconductor is etched away at the desired location to expose the N−type single crystal material. Due to the ever decreasing size of semiconductor circuits, the area of the barrier diode and thus the area to be etched away continues to decrease in size. The limited area to be etched in present day circuits precludes the use of a wet etch process and a dry etch process must be used.

Both the polysilicon to be etched away and the underlying doped silicon material have the same chemical composition. Thus, there is no way in the typical etching process to determine by end point detection where the polysilicon material ends and the underlying single crystal N−type material begins. Therefore, a timed etch process is used whereby the etch proceeds for the period required to etch away the polysilicon material as calculated from the thickness of that material.

This timed etching process contributes to irregularities in the surface of the N−type silicon region in two respects. First, the timed etch process is somewhat imprecise and the etching process occasionally extends past surface of the single crystal N− material. Second, the dry etch process is associated with some mechanical sputtering due to bombardment by gas molecules and this action can cause damage to the N−type single crystal silicon structure when this area is exposed to the gas. The resulting surface irregularities negatively impact the ideality of the barrier diode.

A further complication resulting from the typical fabrication process negatively impacts semiconductor performance. Due to misalignment of Schottky contact mask the typical fabrication process can leave an amount of intrinsic polysilicon material (normally etched away) adjacent the diode. See FIG 17. A parasitic Schottky diode develops where metal comes into contact with intrinsic polysilicon material which could be a source of leakage current.

SUMMARY OF THE INVENTION

This invention relates to the fabrication of semiconductor devices and in particular to the fabrication of Schottky barrier diodes. In the present invention, a layer of oxide material is placed between the surface of the N−type single crystal semiconductor region and the polysilicon material during the fabrication process. The oxide material has a different chemical composition from that of the polysilicon layer or the N−type single crystal silicon region. This fact permits the timed etch process to be replaced with an end point etch process. In the end point etch process, the concentration of gases comprising the plasma gas used for the etch is monitored by analyzing spectrum of the plasma. In this way, one can tell when the plasma gas has etched through one material and contacted another. By placing an oxide layer between the chemically identical materials which make up the polysilicon material and the N−type single crystal region, on& can identify the points at which etch of the polysilicon begins and ends and at which etch of the oxide begins. A wet hydrofluoric acid process can then be used to remove the oxide. The hydrofluoric acid will not etch the underlying N−type silicon region. Overetch of the N−type single crystal silicon is thereby prevented. Furthermore, damage to the surface of the N−type single crystal silicon region due to ion bombardment during the etch is eliminated. The resulting Schottky barrier diode has an improved ideality factor which in turn improves device performance.

The method of the present invention also removes the alignment problems associated with other fabrication processes. In the device of the present invention, the oxide provides a barrier to boron diffusion from P+polysilicon hence no intrinsic polysilicon region is required above the intended diode region. There now remains no alignment issue between Schottky contact and intrinsic polysilicon. This feature eliminates the parasitic Schottky diode formed with the intrinsic polysilicon material.

A further advantage of the present invention which results from the elimination of alignment problems and the improved diode performance is that the semiconductor device can now be further miniaturized. In addition, the process of the present invention may be implemented by inserting a module of steps into the core processes typically used to fabricate such devices. Thus, the benefits of the present invention can be realized without the need to significantly restructure operations and are had at marginal cost.

BRIEF DESCRIPTION OF THE DRAWINGS

FIG. 5 is a silicon substrate to which an additional implant mask has been applied over the polysilicon layer according to an embodiment of the present invention.

FIG. 6 is a silicon substrate to which a layer of silicon nitride is grown as an oxidation mask applied according to an embodiment of the present invention.

FIG. 7 is a silicon substrate undergoing a P-type implant after selective etching of the nitride and polysilicon layers according to an embodiment of the present invention.

FIG. 8 is a silicon substrate after P implantation and mask removal according to an embodiment of the present invention.

FIG. 11 is a silicon substrate showing deposition of low temperature oxide and etch of LTO using contact mask. Indicated is the region in which the diode will be formed according to an embodiment of the present invention.

FIG. 12 is a silicon substrate showing dry etch of the polysilicon layer according to an embodiment of the present invention.

FIG. 13b is a schematic drawing of the device of FIG. 13a.

FIG. 15 is a silicon substrate undergoing a mask step included in typical processes not incorporating the present invention.

FIG. 16 is a silicon substrate with intrinsic polysilicon layer as in typical processes not incorporating the present invention.

DETAILED DESCRIPTION OF THE PREFERRED EMBODIMENT

Fabrication of NPN Schottky clamped transistor will be described as an example of the preferred embodiment of the method of the present invention.

Figure 1:
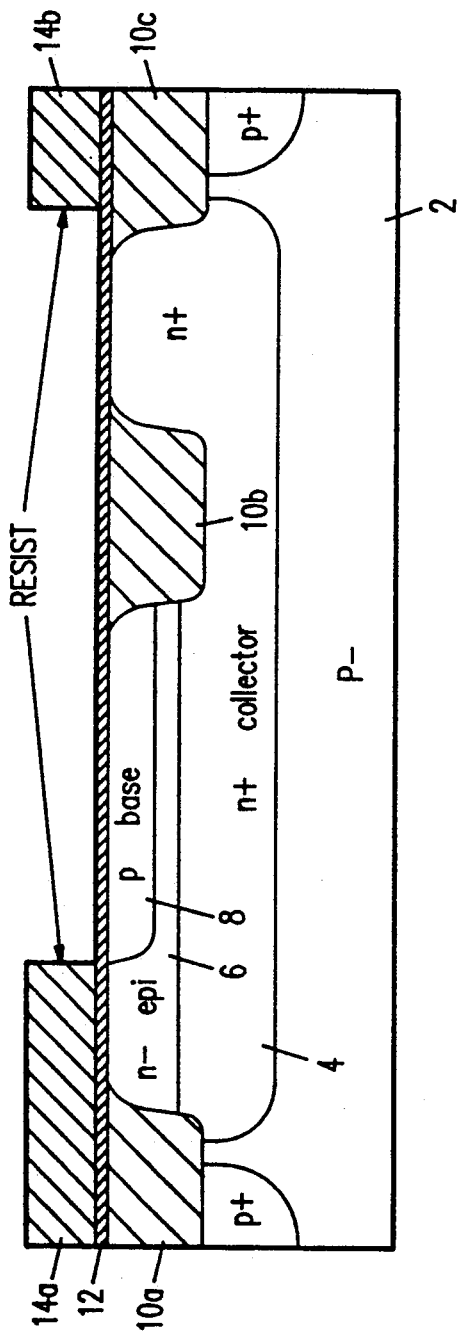
FIG. 1 is a silicon substrate processed according to conventional methods to which an oxide layer and mask have been applied, according to an embodiment of the present invention.

FIG. 1 shows a silicon substrate having undergone preliminary processing according to conventional methods. Silicon substrate 2 is composed of a P−type material. In this figure, silicon substrate 2 has been processed to form a N+ buried layer 4 which serves as the transistor collector and diode cathode. N+ buried layer 4 has a sheet resistance of 24–30 Ω/square and a thickness of 1.2μ. An epitaxial layer 6 is grown on the substrate using well-known techniques. Epitaxial layer 6 is about 1.3 microns thick and has an impurity concentration density of $1 \times 10^{16}$ atoms/cm$^3$. P region 8 forms the base of the transistor. P region 8 is about 1000Å deep and is doped with boron to a concentration of $2 \times 10^{17}$. Oxide regions 10a–c provide isolation between devices, typically by encircling each transistor. Regions 4 through 10 are formed using well known semiconductor process technology, for example, as set forth in the Peltzer U.S. Pat. No. 3,648,125.

A thin oxide layer 12 is shown on the surface of substrate 2. Oxide layer 12 is thermally grown by placing substrate 2 in an oxygen environment at a temperature of 900° for a period of one hour. Oxide layer 12 has a thickness of 300 to 400Å.

Figure 2:
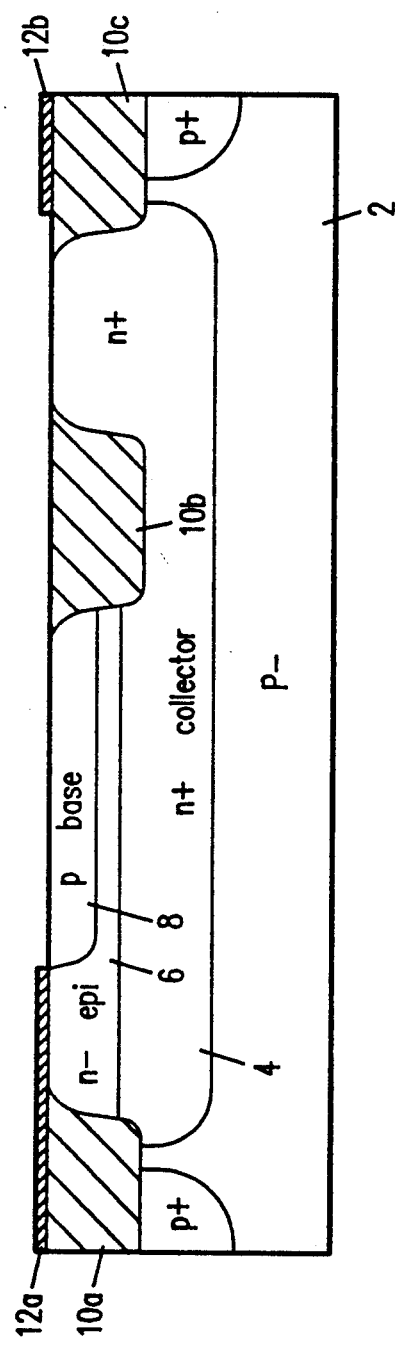
FIG. 2 is a silicon substrate in which the oxide layer has been selectively etched according to an embodiment of the present invention.

After growth of oxide layer 12 a layer of photoresist material is applied and patterned using methods well known in the art over oxide layer 12. The controlled pattern of photoresist permits oxide layer 12 to be etched away using well-known techniques only at those locations not covered by photoresist 14a and 14b. After etch of the exposed portions of oxide layer 12 has been accomplished, photoresist 14a–b is removed. An oxide layer 12a–b remains on the surface of substrate 2 as shown in FIG. 2. Note that oxide region 12a extends over the entire surface area of region 6.

Figure 3:
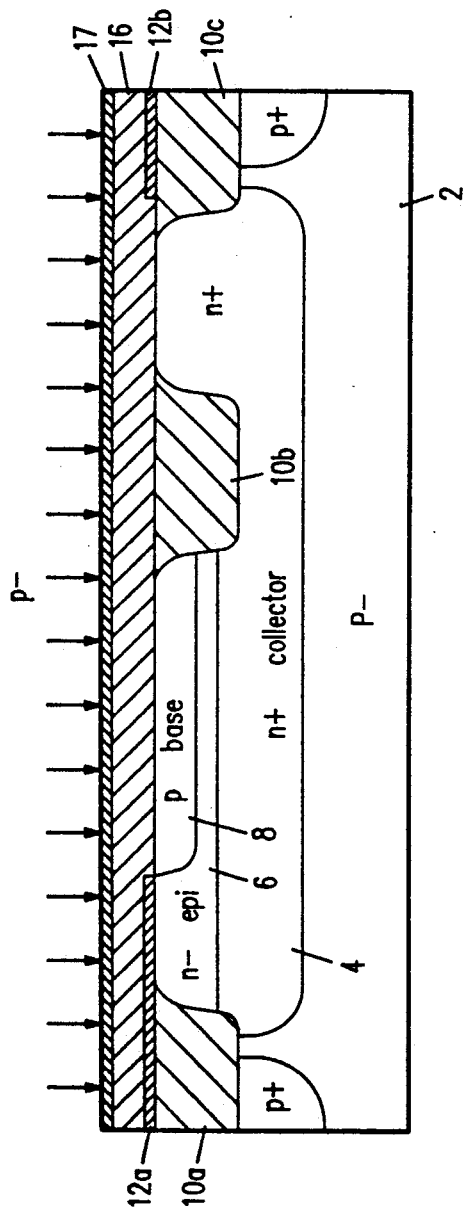
FIG. 3 is a silicon substrate over which a layer of polysilicon has been deposited according to an embodiment of the present invention.

A layer of intrinsic polysilicon 16 is then deposited on the surface of substrate 2 and an oxide layer 17 grown on top of the polysilicon. See FIG. 3. Polysilicon layer 16 is deposited using chemical vapor deposition techniques well-known in the art and has a thickness of 4250Å.

A blanket implant of P material is then made. Although this step is not required to effect the present invention and therefore can be omitted, it is shown here because this step would typically be part of fabrication processes which create resistive devices elsewhere on the substrate. An additional benefit of retaining this step is that processes which contain this step can incorporate the present invention with minimal deviation from the core process.

Figure 4:
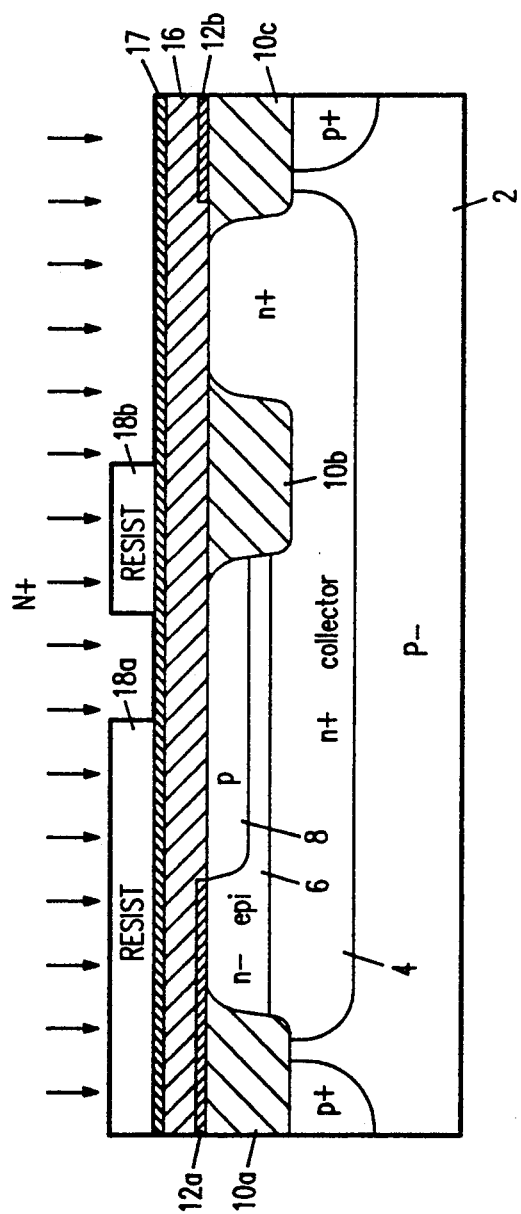
FIG. 4 is a silicon substrate to which an implant mask has been applied over the polysilicon layer according to an embodiment of the present invention.

A mask 18 is then applied on the surface of polysilicon layer 16 in the same manner as described above, resulting in a controlled pattern of photoresist 18a and 18b as shown in FIG. 4. A N−type implant is then introduced into the exposed areas of polysilicon layer 16. A N+ poly material 16a and 16b is formed at the exposed locations. See FIG. 5.

In FIG. 5, another mask process is used to form photoresist areas 20a and 20b. A P-type implant is then applied to create P+ poly regions 16c and 16d in those areas not covered by resist.

Oxide layer 17 remains after creation of P+ poly regions 16c–d and N+ poly regions 16a–c. Atop oxide layer 17, a silicon nitride layer 22 is deposited to provide an oxidation mask. See FIG. 6. In the preferred embodiment, nitride layer 22 is deposited using chemical vapor deposition to a thickness of 1100Å.

Next, the structure is annealed to remove excessive damage and redistribute dopants throughout the polysilicon region. The length and temperature of the anneal process is set up to produce uniform etching of doped polysilicon. In this embodiment, a temperature of 920° C. for a period of 30 minutes proves satisfactory.

The structure is then masked using well-known photolithography techniques as described above to prevent etching of the areas contained under 24a, b and c. The exposed nitride is then dry etched using fluorinated plasma, followed by etch of exposed portions of oxide layer 17 and polysilicon layer 16c and 16d (in FIG. 6) to form the structure shown in FIG. 7.

An additional implant of P-type material is then made to form regions 8a and 8b. See FIG. 8. These heavily doped P+ regions have a final sheet resistance of 280 Ω/square and serve to reduce base resistance of the transistor.

Figure 9:
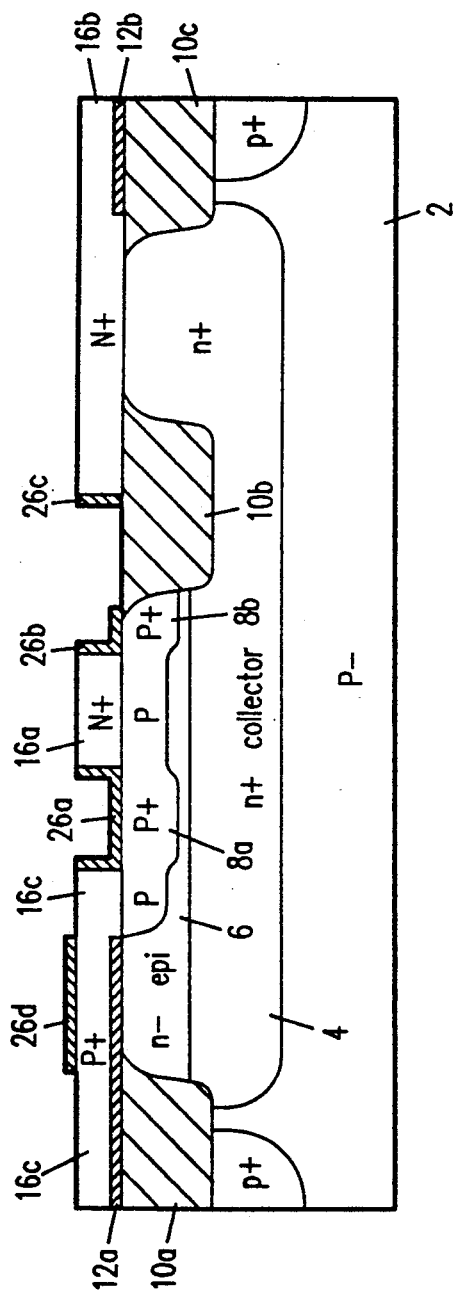
FIG. 9 is a silicon substrate showing masked nitride layer etch and subsequent anneal and thermal oxidation. Note: Layer of oxide over polysilicon region where Schottky contact will be etched. Remaining nitride is then stripped.

The structure is again masked using well-known techniques to form the structure as shown in FIG. 9. The silicon nitride is etched using well-known techniques. One available method is to use $C_2F_6$ and helium plasma in a Sigma 80 reactor. Following removal of the mask, and as also shown in FIG. 9, the structure is annealed at 1000° C. for 30 minutes to activate dopants, remove crystal damage and then is thermally oxidized to form a layer of silicon dioxide 26a, 26b, 26c and 26d.

Next, a relatively thin layer of a refractory metal such as titanium, molybdenum or tungsten is deposited. The metal is deposited in a substantially pure form at a relatively low temperature, for example, using RF sputtering. In the preferred embodiment approximately 700Å of titanium are deposited and reacted in a rapid thermal anneal system; a method well known in the art.

Figure 10:
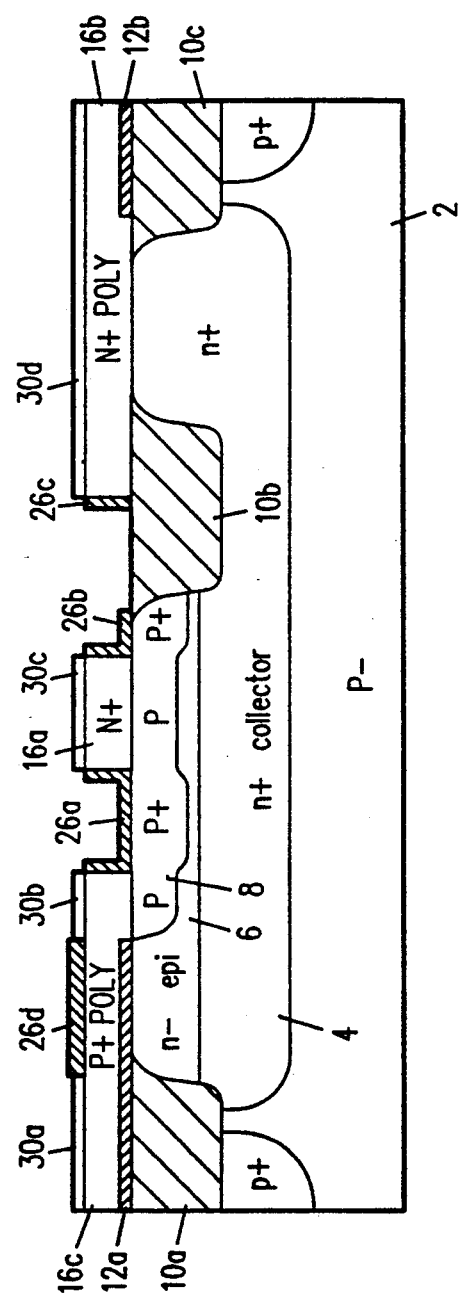
FIG. 10 is a silicon substrate showing deposition and formation of titanium silicide according to an embodiment of the present invention.

As a result of the heating, titanium silicide will be formed everywhere titanium has been deposited on polysilicon, but will not be formed anywhere the metal has been deposited on silicon dioxide. Thus, the fabrication of titanium silicide regions on the semiconductor structure is self-aligned to the polycrystalline regions underlying the silicide as in regions 30a, b, c, d in FIG. 10. The structure shown in FIG. 10 results.

Following fabrication of the titanium silicide, the remaining titanium is selectively etched away in a solution of ammonium hydroxide ($NH_4OH$) and hydrogen peroxide ($H_2O_2$). The solution dissolves titanium but does not dissolve titanium silicide. The same solution can be used to remove unreacted tungsten if tungsten silicide is to be formed instead of titanium silicide. For a molybdenum silicide process, phosphoric acid ($H_3PO_4$) is used to dissolve unreacted molybdenum on oxide regions but not the molybdenum silicide. Following removal of the unreacted refractory metal, the structure is again heated to lower the sheet resistance of the silicide. In the preferred embodiment this is achieved by heating the structure to 900°-1000° C. for 10 seconds. As shown in FIG. 6, silicide regions 30a and 30b are deposited upon base contact electrode 16c to provide a low resistance connection to base 8 and to provide electrical connections to the diode to be formed. Silicide 30c on emitter contact 16a provides a connection to the emitter region. Silicide region 30d on 16b provides a collector contact.

Figure 13A:
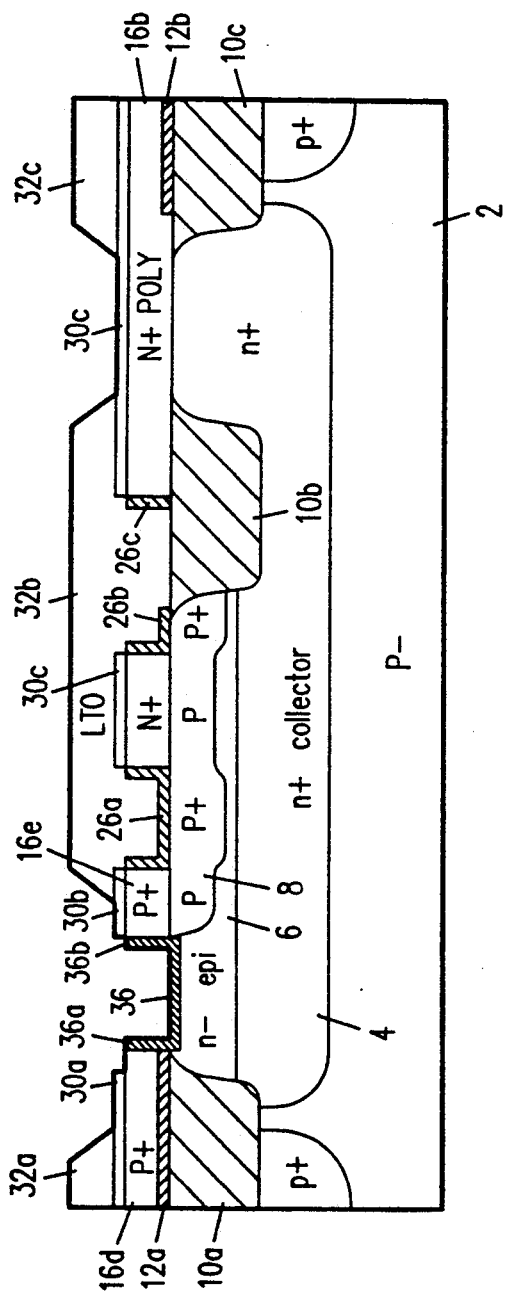
FIG. 13a is a silicon substrate including a platinum silicide Schottky barrier diode formed according to an embodiment of the present invention and also showing a circuit equivalent.
Figure 13B:
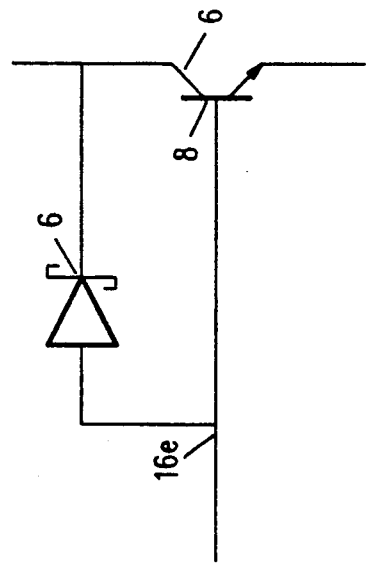

The Schottky barrier diode of the present invention is to be formed in the region A shown in FIG. 11. A low-temperature oxide insulation layer 32 is deposited as shown in FIG. 11 masked with photoresist and contacts are then etched through this layer. On top of layer 32 and all surface areas of the structure except for region A, photoresist 34 is placed. A dry plasma etch (anisotropic) is then used to etch through the exposed area of polysilicon layer 16c, resulting in the structure of FIG. 12. The exposed portion of oxide layer 12a preferably is removed via an oxide dip: a short wet etch in dilute hydrofluoric acid (HF). Resist 34a and 34b are removed after this step. Formation of the barrier diode is completed by deposition of platinum and subsequent platinum silicide formation in region 36. The completed structure is as shown in FIG. 13(a). The circuit equivalent is shown in FIG. 13(b).

Figure 14:
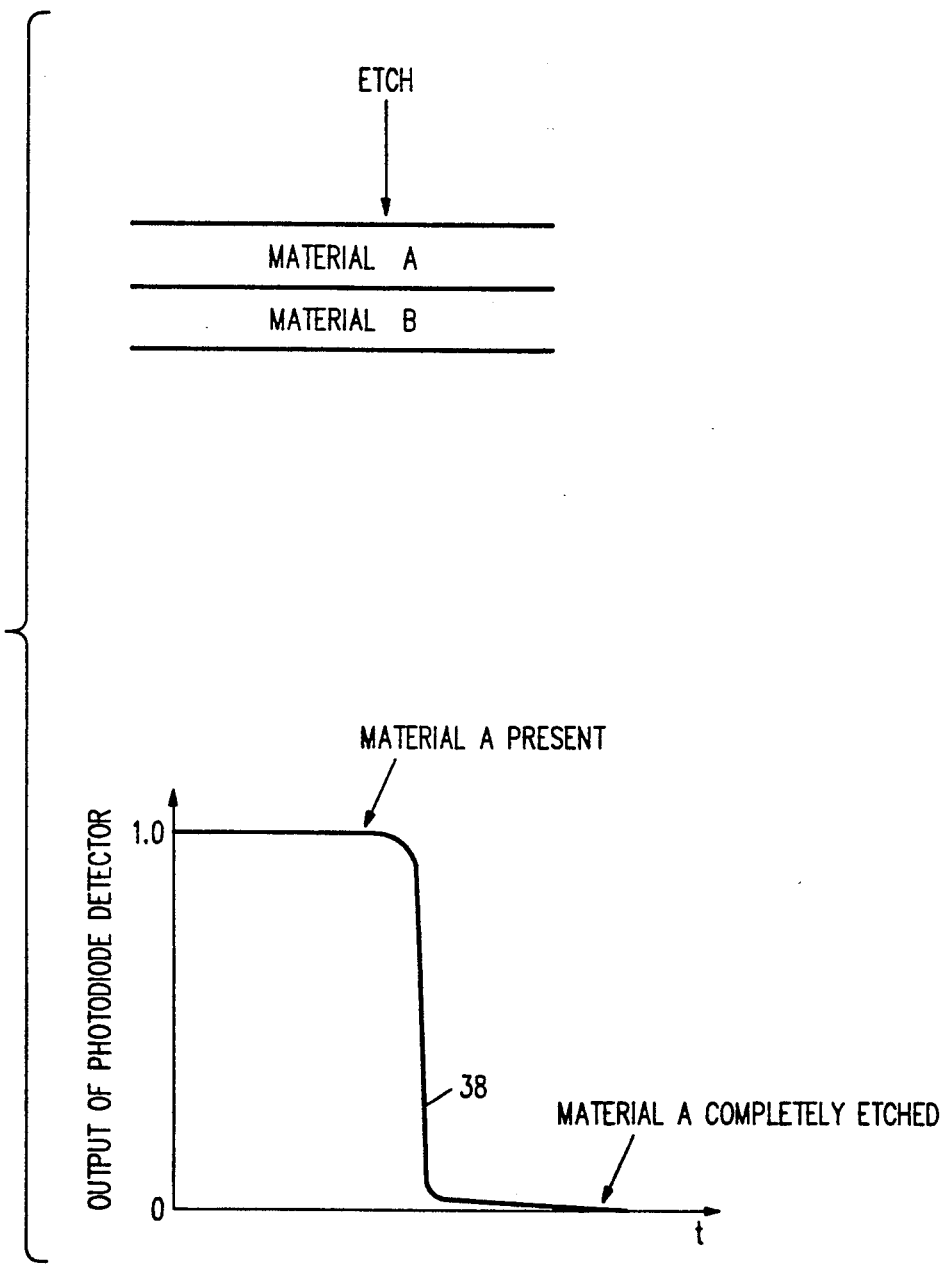
FIG. 14 depicts an end point process.

Use of a dry plasma etch to produce FIG. 12 from FIG. 11 permits miniaturization of the structure not possible with a wet etch process. Control of the dry etch process may be achieved by using either a timed etch or an end point process. In an end point process, the composition of gases contained in the plasma gas can be monitored to determine what material is presently being etched by the plasma gas. Monitoring of the plasma gas composition can be accomplished using either a laser, a spectrograph, or gas concentration monitoring. The end point process is most effective when the material to be etched is chemically dissimilar from the underlying material not to be etched. Thus, when etch of desired material is complete, composition of the gases in the plasma changes. The change in gas composition, known as an end point, signals a halt to the etching process. The end point principle is illustrated graphically in FIG. 14. Item 38 denotes the end point.

In the process of the present invention, oxide layer 12a has been formed between polysilicon layer 16c and region 6 of the substrate. Oxide layer 12a is chemically dissimilar from layer 16 and layer 6. Thus, in the fabrication process of the present invention, the end point process can be used to etch through polysilicon 16 in the contact area for the barrier diode. A dilute hydrofluoric acid etch can then be used to remove oxide layer 12a and expose the contact area.

Use of this process made possible by inclusion of oxide layer 12a of the present invention has several advantages over use of alternate timed etch processes. In a timed etch process, the duration of the plasma etch is calculated from the thickness of the material to be etched. This method is less precise than the end point method and frequently results in overetch of the material.

Because some ion bombardment is associated with plasma etch process, overetch can cause physical damage to the underlying material and also impregnation of reactive species into the substrate. In the formation of the barrier diode, overetch would damage layer 6 of the substrate which contacts the anode of the diode. Damage to layer 6 results in an imperfect Schottky barrier between platinum silicide anode 36 of the diode and layer 6. Imperfections in the silicide to substrate contact negatively impact diode performance and ideality.

Other Schottky barrier diode fabrication processes are forced to use the timed etch method or forego the miniaturization advantages of the dry etch process. Such processes do not include the chemically dissimilar oxide layer 12a of the present invention which separates the to-be-etched polysilicon layer from the underlying substrate and permits use of the end point process. The process of the present invention therefore prevents overetch of the silicon and associated complications. Diodes fabricated with processes not incorporating the present invention are less ideal and result in circuit performance inferior to that obtained with diodes of the present invention.

Figure 17:
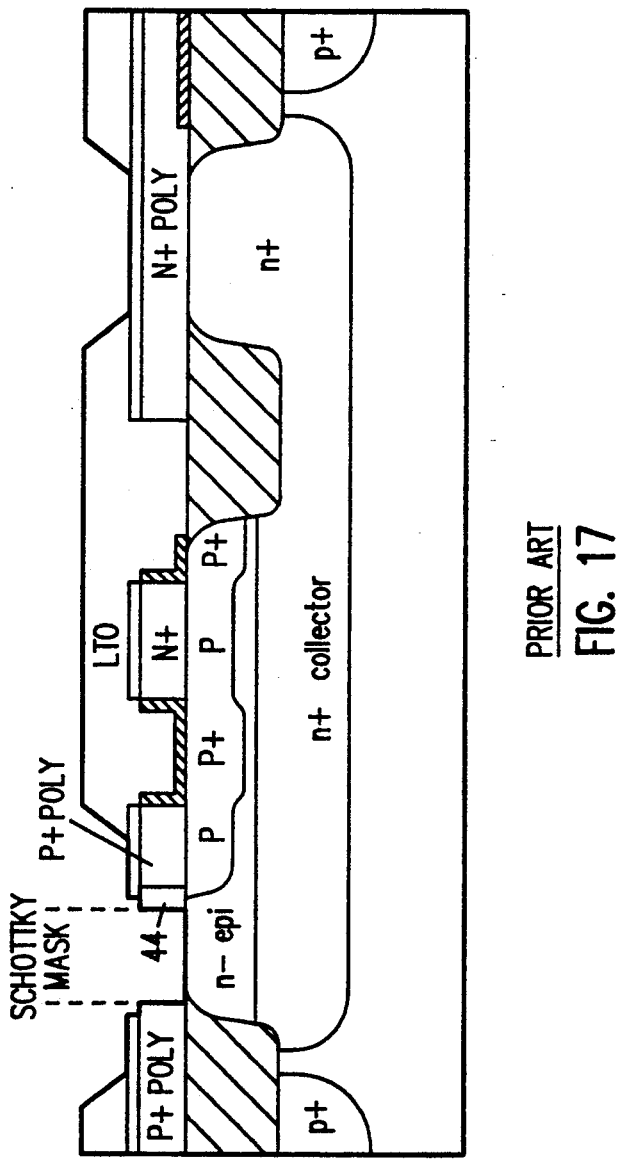
FIG. 17 is a silicon substrate with barrier diode formed using a typical process not incorporating the present invention.

Other advantages of the method of the present invention are apparent in FIGS. 15 through 17. FIG. 15 shows a step in a fabrication process not incorporating the present invention. In this fabrication process, an intrinsic polysilicon region 42 must be etched away to form the barrier diode. This intrinsic polysilicon layer requires an additional mask 40 as shown in FIG. 15 be included in such a process. This mask would not be necessary in the process of the present invention. FIG. 15 corresponds to the step of the present invention depicted in FIG. 5.

The inclusion of additional mask 40 also creates alignment problems which ultimately affect diode performance. Resist 40 as shown in FIG. 15 must be perfectly aligned with the portion of N— epitaxial region 6 which contacts polysilicon region 16. This requirement stems from the fact that the diode must be a metal to N−
region contact. If mask 40 is not perfectly aligned, a
region of intrinsic polysilicon material 44 will remain on
one side of the masked area as shown in FIG. 17. This
region will become doped with P-type material during
the step shown in FIG. 15. The P-type material can
diffuse into layer 6 altering the N−type characteristics
of this layer and negatively affecting diode performance. Specifically, the diffusion of this material increases the potential barrier height of the diode. Alternatively, even if intrinsic polysilicon region 44 remains
undoped, a parasitic diode will form in the regions
where 44 contacts the platinum silicide anode. These
parasitic diodes are a source of leakage currents which
impair performance.

As may be seen in FIG. 13(a), a Schottky clamped
transistor completed according to the process of the
present invention presents no alignment problems. The
need to keep region 42 intrinsic polysilicon (see FIG.
16) to prevent diffusion of the P-type dopant into region
6 has been eliminated by the inclusion of oxide layer 12a
(see FIG. 12). Oxide layer 12a prevents diffusion of the
P material into region 6 during the step shown in FIG.
5 of the process of the present invention. Thus, the need
for mask 40 has been eliminated. As a result, there exist
no sidewalls of intrinsic polysilicon surrounding the
diode; and the platinum silicide anode contacts the entire length of region 6 as shown in FIG. 13(a). The
parasitic diodes of typical processes are eliminated.

The aforementioned advantages of the method of the
present invention may be realized with minimal deviation from other core processes used to fabricate similar
devices. The steps depicted in FIGS. 1 and 2 are the
only additional steps required. In addition, the mask
(40) step of other processes as shown in FIG. 15 is removed. Elimination of this step not only saves costs but
avoids the previously described derivative problems
associated with misalignment of this step. A greater
manufacturing yield rate should result. Finally, the
blanket P− implant described in FIG. 5 may be optionally retained or removed. The minimal deviation from
other core processes required to implement the present
invention means the advantages and improvements of
the present invention may be had with only marginal
effort and cost.

The preferred embodiments of the invention have
now been described. Other variations will now be
readily apparent to those skilled in the art. For example,
although the invention was explained in terms of fabricating a Schottky clamped transistor, the principle of
using an oxide layer disposed between the device surface and the polysilicon layer may be incorporated into
any fabrication scheme where manufacture of a
Schottky barrier diode is required and corresponding
improvements as disclosed herein achieved. For this
reason, the invention should be construed in light of the
claims.

What is claimed is:

1. A process for forming a diode on an integrated
circuit substrate having a top surface, in which there has
been formed at a selected location an N conductivity
type region, the process comprising the steps of:
  (a) forming an oxide layer over the top surface of the
    substrate;
  (b) depositing a layer of material having a chemical
    composition different from said oxide layer over
    the top surface of said substrate and said oxide
    layer;
  (c) removing said material by an anisotropic dry etch
    having an end point process at least in a selected
    region where a diode anode is to be formed and
    wherein the removal of said material is halted on
    said oxide layer;
  (d) removing said oxide with a nonplasma process to
    expose said N region at least over a given portion
    of said N region which contacts the surface of said
    substrate; and
  (e) depositing a metal on said exposed portion of said
    N region to form a diode anode.

2. The invention of claim 1 wherein said metal comprises platinum and wherein platinum silicide is formed.

3. A process for forming a Schottky clamped transistor on an integrated circuit substrate having a top surface, in which there have been formed in selected locations, an N− epitaxial region, a P base region, a N+buried layer to serve as diode cathode and transistor collector and a field oxide region to isolate the transistor,
the process comprising the steps of:
  (a) forming an oxide layer over the top surface of the
    substrate;
  (b) removing the oxide layer using a mask such that
    said oxide layer remains at least along a width of
    said N− epitaxial region where said N− epitaxial
    region forms the top surface of said substrate;
  (c) depositing a layer of polysilicon over the top
    surface of said substrate and said oxide layer;
  (d) removing the polysilicon using a mask to form
    emitter, base, collector, interconnect and diode
    contacts wherein said polysilicon located over said
    oxide layer removed to form said diode contact is
    halted on said oxide layer;
  (e) removing said oxide layer with a nonplasma process to expose said N− epitaxial region; and
  (f) depositing a metal on said width of the N− epitaxial region where said N− region contacts the surface of said substrate to form a diode anode.

4. The invention of claim 3 further comprising the
step of:
  heating said substrate to remove crystalline lattice
    damage and make said dope regions electrically
    active.

5. The invention of claim 3 wherein step (d) further
comprises a dry etch end point process to etch said
polysilicon region located over said oxide layer where
said diode anode is to be formed.

6. The invention of claim 3 wherein step (d) further
comprises the steps of forming a refractory metal-silicide layer over selected portions of said polysilicon
layer.

7. The invention of claim 3 wherein said metal used to
form said diode anode comprises platinum and wherein
platinum silicide is formed.

8. The invention of claim 3 further comprising the
step of doping selected regions of said P regions with a
P-type impurity.

9. The invention of claim 3 further comprising:
  depositing a low-temperature oxide insulating layer
    over selected regions of said polysilicon layer.

10. A process for forming a Schottky clamped transistor on an integrated circuit substrate having a top surface, in which there have been formed in selected locations, an N− epitaxial region, a P base region, a N+
buried layer to serve as diode cathode and transistor
collector and a field oxide region to isolate the transistor
comprising the steps of:

(a) forming an oxide layer over the top surface of the substrate;

(b) etching the oxide layer using a mask such that said oxide layer remains at least along a width of said N− epitaxial region where said N− epitaxial region forms the top surface of said substrate;

(c) depositing a layer of polysilicon over the top surface of said substrate and said oxide layer;

(d) doping selected areas of said polysilicon with N-type impurities and selected areas of said polysilicon with P-type impurities;

(e) etching the doped polysilicon areas using a mask to form emitter, base, collector, interconnect and diode contacts wherein said polysilicon region located over said oxide layer etched to form said diode contact is halted on said oxide layer;

(f) removing said oxide layer with an acid to expose said N− epitaxial region; and (g) depositing a metal on said width of the N− region where said N− region contacts the surface of the substrate to form a diode anode.

11. The invention of claim 10 further comprising the step of:

heating said substrate to remove crystalline lattice damage and make said doped regions electrically active.

12. The invention of claim 10 wherein step (e) further comprises a dry etch end point process to etch said polysilicon region located over said oxide layer where said diode anode is to be formed.

13. The invention of claim 10 wherein step (e) further comprises the steps of forming a refractory metal-silicide layer over selected portions of said polysilicon layer.

14. The invention of claim 10 wherein said metal used to form said diode anode comprises platinum and wherein platinum silicide is formed.

15. The invention of claim 10 further comprising the step of doping selected regions of said P regions with a P-type impurity.

16. The invention of claim 10 further comprising:
depositing a low-temperature oxide insulating layer over of said polysilicon layer.

17. The process of claim 1, wherein the step of forming an oxide layer in step (a) further comprises the step of removing portions of the oxide layer using a mask such that said oxide layer remains at least along a width of said N region where said N region adjoins the top surface of said substrate.

* * * * *